United States Patent [19]
Abadeer

[11] Patent Number: 6,049,213
[45] Date of Patent: Apr. 11, 2000

[54] METHOD AND SYSTEM FOR TESTING THE RELIABILITY OF GATE DIELECTRIC FILMS

[75] Inventor: Wagdi W. Abadeer, Jericho, Vt.

[73] Assignee: International Business Machines Corporation, Armonk, N.Y.

[21] Appl. No.: 09/014,317

[22] Filed: Jan. 27, 1998

[51] Int. Cl.[7] .................................................. G01R 31/26
[52] U.S. Cl. ........................ 324/719; 324/765; 324/537
[58] Field of Search .................................. 324/713, 716, 324/719, 763, 765, 769, 537; 438/14, 17; 365/185.09, 201

[56] References Cited

U.S. PATENT DOCUMENTS

| | | | |
|---|---|---|---|
| 3,943,442 | 3/1976 | Fletcher et al. | 324/765 |
| 4,382,229 | 5/1983 | Cottrell et la. | 324/765 |
| 5,032,786 | 7/1991 | Kimura | 324/765 |
| 5,515,318 | 5/1996 | Cappeletti et al. | 165/201 |
| 5,600,578 | 2/1997 | Fang et al. | 324/765 |
| 5,615,377 | 3/1997 | Shimizu et al. | 324/765 |
| 5,786,689 | 7/1998 | Kimura | 324/765 |
| 5,793,212 | 8/1998 | Om | 324/765 |

FOREIGN PATENT DOCUMENTS

| | | |
|---|---|---|
| 60-254625 | 12/1985 | Japan . |
| 8-23019 | 1/1996 | Japan . |
| 8-46000 | 2/1996 | Japan . |
| 2296778A | 7/1996 | United Kingdom . |

*Primary Examiner*—Diep N. Do
*Attorney, Agent, or Firm*—Ratner & Prestia; Tiffany L. Townsend

[57] ABSTRACT

A method for estimating the longevity of a gate dielectric film of a semiconductor device. A plurality of test bias voltages are applied to a plurality of test semiconductor devices. The test gate currents drawn in the respective dielectric films of the test semiconductor devices in response to the test bias voltages are measured. A relationship is determined between the test gate currents and the longevity of the test semiconductor devices. A production semiconductor device is biased with a predetermined bias voltage. The gate current drawn through the gate dielectric film of the semiconductor device in response to the predetermined bias voltage is measured. The longevity of the gate dielectric film of the production semiconductor device is estimated based on the measured gate current, using the determined relationship.

35 Claims, 15 Drawing Sheets

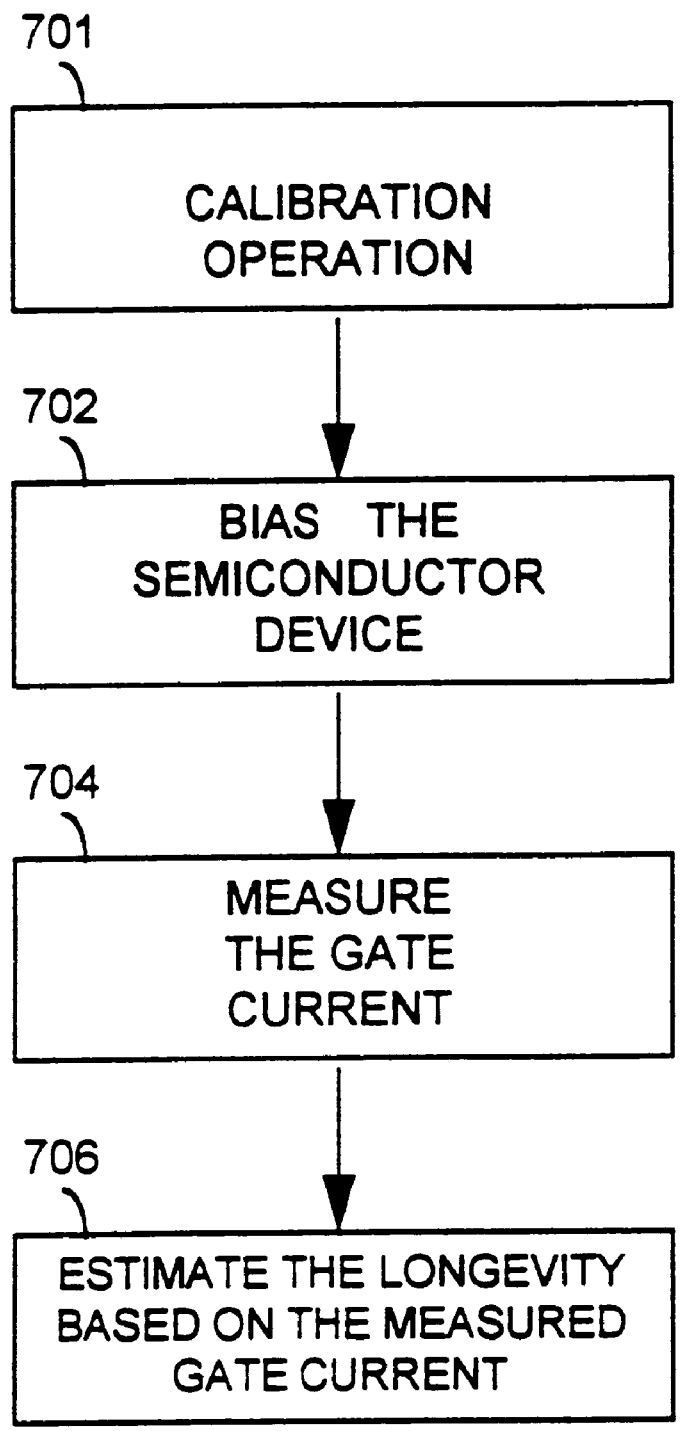
FIG. IA

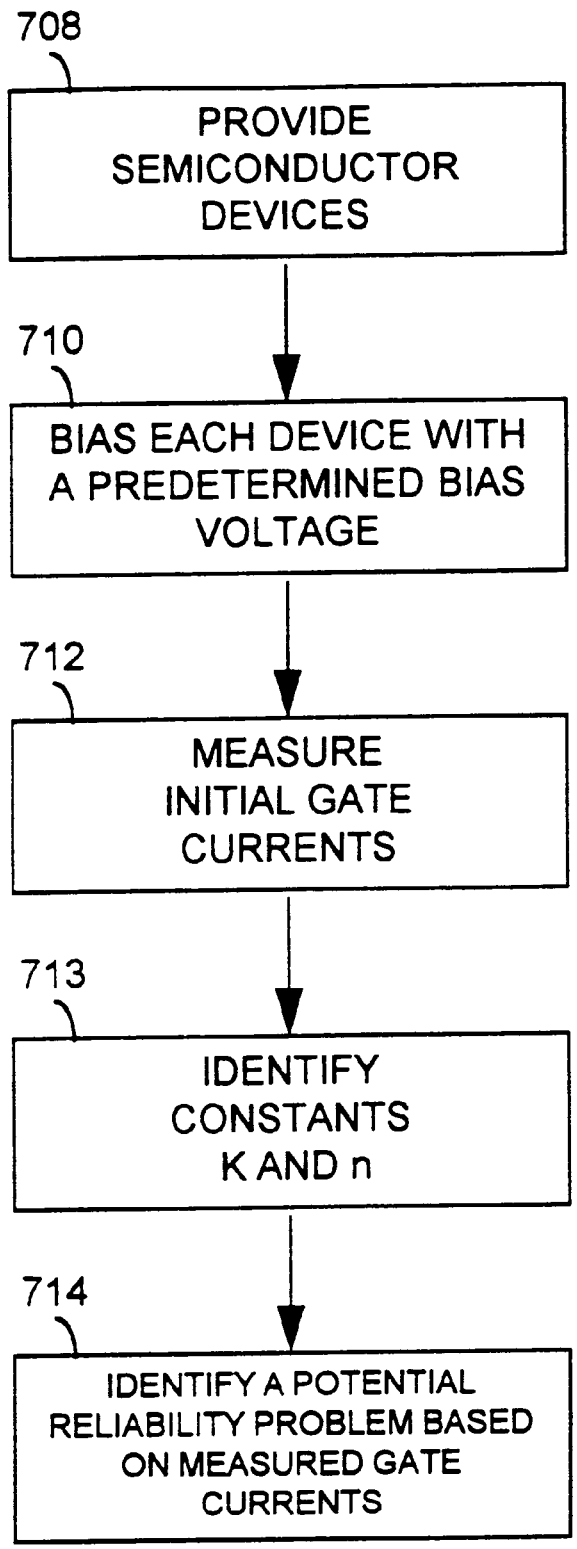
FIG. IB

METHOD AND SYSTEM FOR TESTING THE RELIABILITY OF GATE DIELECTRIC FILMS

FIELD OF THE INVENTION

The present invention relates to a method and system for testing the reliability of semiconductor devices generally, and more particularly, to a method and system for testing the reliability of gate dielectric films for semiconductor devices.

BACKGROUND OF THE INVENTION

Semiconductor integrated chips may utilize field effect transistors (FET's). FET'S, such as metal oxide semiconductor transistors, employ a gate dielectric film which is necessary for the switching operation of a transistor. Thermal oxide (e.g., $SiO_2$) has long been the dominant dielectric material for FET's, very large scale integration (VLSI) and ultra large scale integration (ULSI). The excellent dielectric properties of thermal oxide allow manufacturers to consistently manufacture reliable integrated circuit (IC) chips that meet desired yield objectives.

Significant advancements in processing technologies of IC chips have continuously reduced the size of a unit transistor. Decreasing the size of transistors is sometimes referred to as technology scaling. The density of transistors has constantly increased from generation to generation of IC chips. The density of the IC chip is measured by the number of transistors or circuits which can be designed in a certain area of the IC chip. By reducing the size of single transistor, the operating speed of the FET is increased. Conversely, the time delay of the transistor or the time required to process an input command is decreased. The scaling of an FET results in reduction of both the lateral and vertical dimensions of the transistor. The scaling of the vertical dimensions leads to a reduction in the gate dielectric film thickness.

Within the past five years, technology scaling has increased the density of IC's by a factor of 2.5 or more, with a corresponding reduction of the gate dielectric film thickness by almost the same factor. For example, the gate dielectric film thickness of a typical FET has been reduced from about 12 nanometers to 5 nanometers.

Technology scaling has also dictated reductions in the operating voltage of an FET. The reduction in gate dielectric film thickness by a factor of about 2.5 over the past 5 years has been accompanied by reductions in the operating voltage (Vdd) by less than the factor of 2.5. Generally, the reduction in Vdd has not been directly proportional to the reduction in gate dielectric film thickness. As a result, the electric field strength across the gate dielectric film has increased. The yield and the reliability requirements for gate dielectric films are more difficult to meet because of the reduction in the gate dielectric film thickness and the resultant increase in electric field strength.

Reliable operation of the FET depends upon the reliability of the gate dielectric film. One measure of the gate dielectric film reliability is dielectric leakage current. The dielectric leakage current should be within established specifications under normal operating conditions and for the intended operating life time, typically 10 years of the product. If the gate dielectric film leakage is higher than the specification, the gate dielectric film is defective. Excessive gate dielectric film leakage is usually referred to as "dielectric breakdown" or "dielectric failure." Sometimes, the gate dielectric film is defective at the time of manufacture. Other failures occur during use.

The gate dielectric film should meet its yield and reliability objectives for the intended useful lifetime, under the specified operating voltage, temperature, and environmental conditions in accordance with all design implementation rules and guidelines. Design implementation rules vary for large area versus small area layout applications and for FET versus thin-oxide capacitor applications. Design guidelines include various product-test design mask levels.

Reliability testing of the gate dielectric film involves generation of accelerated life stress data to assess the product lifetime. Accelerated life stress testing degrades the gate dielectric film in a time-accelerated manner to produce measurable effects within a relatively short time. Testing of the gate dielectric film may require from less than one hour to over one year to produce the desired information for any given stress test condition. The time-acceleration of the degradation and breakdown mechanism is achieved by proper design of the parameters controlling the degradation and breakdown process. Typical test parameters are voltage and temperature.

The test and stress conditions normally exceed the intended conditions for normal use so that the mechanism of dielectric degradation/breakdown is temporally accelerated.

Usually, the technology reliability development activities employ a combination of test site vehicles, a cut version, a prototype of a product, or a specific design. The technology development test site normally contains several types of technology implementation guidelines and rules for the use of the gate dielectric material.

Information accumulated during technology development is integrated to define the physics and engineering models that govern the behavior and mechanism of dielectric film degradation and breakdown. The physics and engineering models are used for establishing the system and procedure through which routine monitoring of gate dielectric film integrity and reliability is maintained. A significant aspect of the routine monitoring of gate dielectric film reliability in manufacturing is the practicality, efficiency, and economy of routine testing for large manufacturing volumes. In contrast to initial technology development, routine monitoring of the manufacturing process for reliability should not require a protracted test period.

Prior art testing methods often destroy the gate dielectric film in the transistor by timing a time-to-breakdown of the dielectric. For example, Japanese Patent Application No. 08-046000 describes a destructive test resulting in dielectric breakdown. The test may require an extended time duration for the test to be completed because dielectric breakdown is required. A stress field is applied to the dielectric oxide. The total charge required to induce breakdown is measured just prior to breakdown of the oxide. The lifetime of the oxide for actual use conditions is estimated based on the total charge.

UK patent application GB 2 296 778A and Japanese patent application No. 08-023019 describe another destructive test resulting in dielectric breakdown. The test may require an extended period for execution. An initial current density is applied to the dielectric. The current density is increased in successive steps, or increased gradually as a function of time until dielectric breakdown is reached.

Other testing methods may not destroy the dielectric, but may induce permanent changes to the device characteristics. Japanese Patent JP 84109958, issued to F. Masumi and N. Hisatoshi, describes a test which changes the characteristics of the tested device. The test uses direct current and alternating current in accelerated stress measurements on Schottky gate FET's.

Other testing methods do not provide complete tests for gate dielectric film reliability. For example, U.S. Pat. No.

4,382,229 describes a reliability testing monitor limited to the channel hot-carrier mechanism. The gate current of an FET is measured as a function of time under accelerated stress conditions. Similarly, U.S. Pat. No. 5,615,377 describes a reliability test limited to the testing of channel hot carriers.

A need exists for a nondestructive test of gate dielectric film reliability, which is generally applicable to a wide variety of semiconductors. Furthermore, the need exists for a test that does not require a protracted test period and may be applied readily to monitor the manufacturing process.

SUMMARY OF THE INVENTION

The present invention is a method and system for estimating the longevity of a gate dielectric film of a semiconductor device. The semiconductor device is biased with a predetermined bias voltage. A gate current drawn through the gate dielectric film of the semiconductor device in response to the predetermined bias voltage is measured. The longevity of the gate dielectric film is estimated based on the measured gate current.

BRIEF DESCRIPTION OF THE DRAWINGS

FIG. 1A is a flow chart showing an exemplary method for estimating the longevity of the gate dielectric film of a semiconductor device.

FIG. 1B is a flow chart showing an exemplary method for performing the calibration operation shown in FIG. 1A.

OVERVIEW

Figure 2A:
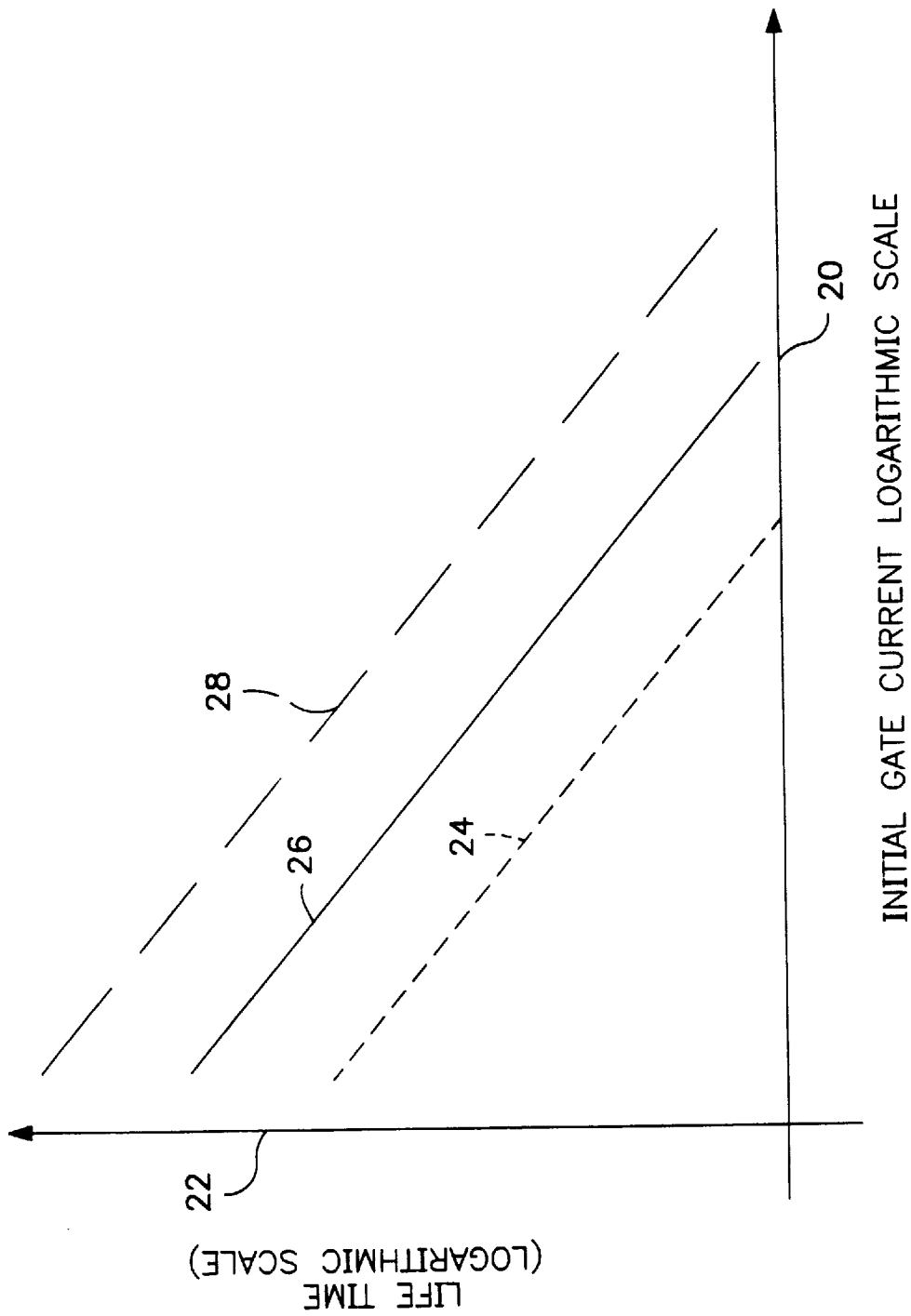
FIG. 2A is a graph showing an inverse power law relationship between initial gate current and the longevity of the semiconductor device.

The present invention is a method and system for estimating the reliability and longevity of the gate dielectric film of a semiconductor device using a nondestructive test. The semiconductor device is biased with a predetermined voltage. The gate current drawn through the gate dielectric film of the semiconductor device is measured while the semiconductor device is biased. The longevity of the gate dielectric is estimated based on the measured gate current.

The estimation may be accomplished using a relationship between the gate current and the associated longevity for test devices. The relationship is a power law function in which the gate current with a negative exponent power is proportional to the estimated longevity of the semiconductor device.

The relationship may be determined in a calibration operation during the technology development phase, by collecting data from a plurality of test semiconductor devices. The data relate the gate dielectric current to the longevity of the test devices. Once the relationship is determined, the same relationship may be used during the manufacturing production phase to estimate the longevity of a production semiconductor device, based on as few as a single measurement of the gate dielectric current resulting from a known gate conductor bias voltage.

Preferably, a calibration process is performed for each type of gate dielectric material used in manufacturing production, and the calibration includes semiconductor devices having an assortment of different designs.

The test system for evaluating the longevity of the gate dielectric film of a semiconductor device may include an energy source, a current monitor, and an indicator. The energy source biases the semiconductor device with a bias voltage. The current monitor measures gate current while the device is biased. The current monitor or the semiconductor device may be connected to an indicator for indicating if the gate current exceeds a threshold current.

The test system and method may be used to evaluate manufacturing problems and to isolate the causes of problems detected during the semiconductor manufacturing processes.

DETAILED DESCRIPTION

FIG. 1A is a flow chart showing a first exemplary method for estimating the longevity of a gate dielectric film. The method may be practiced with any of the exemplary test systems and devices described below with reference to FIGS. 1A through 11.

At step 701, a relationship between the bias voltage and the gate current is determined in a "calibration operation," which is described in detail below with reference to FIG. 1B. The longevity of the gate dielectric film is related to the current by a power law equation. The calibration operation for determining the relationship may be performed on development test lots when a new device design is first being evaluated, or prior to the selection of a material for a particular device.

A plurality of test semiconductor devices having known specifications are selected. Preferably, each device is subjected to a plurality of bias voltages, including a non-stress voltage and a stress voltage. Then, the amount of time which elapses before any change in the gate current (with a constant voltage) is noted.

During the calibration, an initial gate current at a beginning of life of the semiconductor device is measured in a state of minimal stress and subsequently during the application of stress. Preferably, at least a first voltage yielding gate current conduction in a direct tunneling mode and a second bias voltage in yielding gate current conduction in a Fowler-Nordheim conduction mode are used during the calibration operation of step 701. During the measuring step, any significant change in the gate current is noted and provides an indication of the longevity of the semiconductor device.

The test devices are evaluated. The time to dielectric breakdown is calculated or determined for each test device through real-time testing or accelerated-life testing. A significant change in the gate current measured under stress is used to determine the lifetime of the dielectric material.

Having determined the relationship between gate current and gate dielectric film longevity, longevity testing may be performed routinely on samples of manufacturing production lots, as described below with reference to steps 702, 704 and 706.

At step 702, a semiconductor device to be tested is biased with a predetermined bias voltage. Preferably, the bias voltage used is sufficiently low so that it does not cause any permanent change or damage to the gate dielectric film.

In step 704, the gate current drawn through the gate of the semiconductor device is measured, while the predetermined bias voltage is applied to the semiconductor device.

At step 706, the longevity or reliability of the semiconductor device is estimated based on the gate current measured. The relationship determined during step 701 is used to estimate the reliability.

FIG. 1B shows the calibration operation of step 701 (shown in FIG. 1A). In step 708, a plurality of semiconductor devices is provided. Each of the semiconductor devices has a gate dielectric film.

Test devices used in step 708 for the establishing the relationship between longevity and gate current of the semiconductor devices may be selected based on a variety of factors which may include: dielectric film perimeter length to area ratios; whether the device has a diffusion-region-bounded dielectric film or an STI regions bounded dielectric film, dielectric area ratios, dielectric film layouts, gate conductor material type, and diffusion region material type. Preferably, the test devices used during the calibration of step 701 have gate dielectric films which are comparable to those of the semiconductor devices which are to be tested in production in step 706.

The test devices used in step 708 may be substantially similar to the semiconductor devices to be tested during the manufacturing production phase. A test device may comprise a semiconductor capacitor having one or more of the following features in common with the manufacturing production semiconductor device:

(a) a ratio of dielectric film perimeter length to dielectric film area that is similar to that of the production semiconductor device's gate dielectric film;

(b) a diffusion region similar to the production semiconductor device's diffusion region (if the production semiconductor device has a diffusion region adjoining the gate dielectric film);

(c) an STI region which is comparable to the production semiconductor device's STI region (if the gate dielectric film of the production semiconductor capacitor is bounded by STI regions);

(d) a gate dielectric film area which is approximately equal to the production semiconductor device's gate dielectric film area;

(e) a gate dielectric film layout and gate conductor layout similar to that of the production semiconductor device;

(f) material types and dopant types selected for the semiconductor capacitor are similar to the material types and dopant types for the production semiconductor device.

The above list of common design specifications is merely exemplary in nature;, other criteria may also be used to select the test devices.

It has been determined that the relationship between the initial gate current and the associated longevity is a power law relationship. In particular, the power law relationship substantially follows the equation:

$$tbd = K \times Ig^n \tag{1}$$

where tbd is the estimated time to break-down (longevity) of the semiconductor device, K is a technology-dependent constant, Ig is the gate current of the semiconductor device, and n generally has a negative value of magnitude greater than one. The values of K and n may be determined by graphing the experimental data or by known regression techniques which may be implemented in a computer software program.

The power law relationship may be stored in a database containing data which identify the constants K and n for each of a variety of semiconductor materials and device configurations. In step 706, the database may be used to estimate the longevity of a given type of semiconductor device.

In step 710, each of the semiconductor devices is biased with a plurality of predetermined bias voltages, including at least one bias voltage which produces current in the direct tunneling region (which causes minimal or no stress,) and at least one bias voltage which produces current in the Fowler-Nordheim conduction region (which stresses the gate dielectric.)

In step 712, the initial gate currents drawn by the semiconductor devices are measured while biasing each of the semiconductor devices with the predetermined bias voltages.

In step 714 a potential reliability problem may be identified for one of the test semiconductor device types through a comparison of the initial gate currents measured for each type. If the measured gate currents for two types differ from one another by a threshold value, a problem is identified. If all of the measured gate currents for all of the different test device configurations differ from one another by less than the threshold, then no reliability problem is identified.

The selection of device configurations and the comparison of the gate currents permits evaluation of semiconductor materials, device configurations, and semiconductor manufacturing processes. High gate current associated with a particular material, device configuration or process lead to the identification and diagnosis of a potential reliability problem.

The above-described calibration operation may be used to select a design of the semiconductor device during the engineering stages. The design of the semiconductor device may be selected based upon its estimated longevity.

Figure 2B:
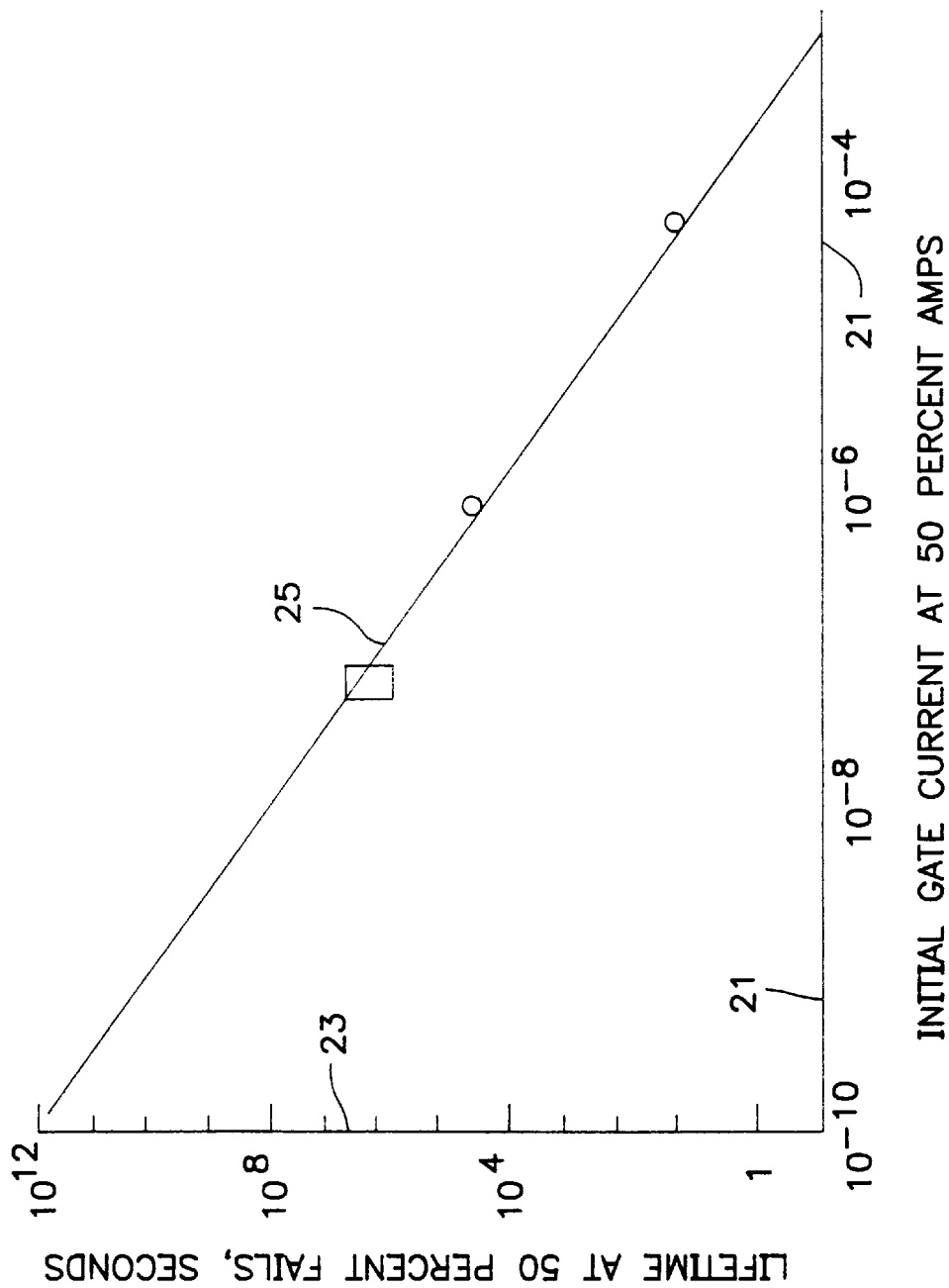
FIG. 2B is a graph of experimental data showing the power law relationship between initial gate current and longevity of a plurality of test devices.

FIG. 2A and FIG. 2B show the power law relationship between gate current and longevity. The vertical axis 23 and the horizontal axis 21 of FIGS. 1C and 1D both have logarithmic scales. These data may be stored in the database 822. The longevity increases toward the top of FIG. 2A while the initial gate current on the horizontal axis 20 increase toward the right. FIG. 2A shows a linear, logarithmic relationship between initial gate current and longevity regardless of the failure rate threshold criterion used. The slopes of the lines associated with different failure rates are substantially identical. The lower failure rate curve 24 shows the lowest statistically significant failure rates associated with the semiconductor device. For an equal initial gate current, the longevity associated with the 50% failure rate curve 26 is lower than the longevity associated with a 100% failure rate curve 28.

FIG. 2B shows gate current in amps on the horizontal axis 21 versus longevity of the gate dielectric in seconds on the vertical scale 23 based on experimental measurements of semiconductor devices 810 with a variety dielectric thicknesses. The legend for the symbols on the graph of FIG. 2B is shown in Table 1, below

TABLE 1

| Symbol | Dielectric Thickness | Voltage Range | Process Condition | Temperature |
| --- | --- | --- | --- | --- |
| O | 3.93 nm | 4.1V–5.0V | A | 180 C. |
| * | 3.58 nm | 4.1V–5.0V | A | 180 C. |
| + | 3.60 nm | 4.1V–5.0V | A | 180 C. |
| □ | 3.93 nm | 3.7V | A | 180 C. |
| × | 3.28 nm | 3.9V–4.1V | A | 180 C. |
| ▽ | 3.37 nm | 3.9V–4.1V | B | 180 C. |
| Δ | 3.43 nm | 3.9V–4.1V | C | 180 C. |
| A | 3.30 nm | 3.9V–4.1V | D | 180 C. |

During the experiments, several test semiconductor device configurations and bias voltages were tested, as shown in Table 1. The linear, logarithmic relationship on FIG. 2B represents a fifty percent failure rate.

It is believed that FIGS. 1C and 1D show a universal relationship, which is true regardless of dielectric thickness, stress voltage, and details of dielectric processing conditions. At lower dielectric thickness, the gate current is higher and the lifetime is correspondingly reduced according to the power law relationship of equation (1), above. At higher voltage conditions, the gate current is also high and the lifetime is correspondingly reduced. The time-to-breakdown, tbd, is determined based on the reliability accelerated stress data, which are preferably collected during the technology development phase.

With reference to equation (1), the constant K is in general, a function of the bias conditions (positive versus negative gate bias) as well as the type of MOS capacitor. K may vary with the specific type of processing conditions. K is calculated along with the factor n by finding a best fit power law relationship between the gate current and the lifetime. Preferably, this best fit is found after many stress trials are completed (usually at different temperatures and voltage conditions) to construct the relationship shown in FIG. 2B. The data are also collected for the entire process window conditions, and preferably for all of the Structures A through T. The accelerated life stress data also determine the parameters according to which the breakdown mechanism operates.

Those parameter are conventionally referred to as acceleration parameters, for example, of voltage and temperature. Based on known techniques, the accelerated stress data are transformed to projected reliability performance and objectives based on nominal operating conditions. Combined with the gate current measurements performed during the development phase, reliability control limits can be set on the gate current values at different bias voltage conditions. The control limits become the basis for the manufacturing control system for ultra thin dielectrics.

Table 2 lists a plurality of exemplary test semiconductor device bias configurations and polarities for estimating dielectric longevity or evaluating a semiconductor manufacturing process. The exemplary test devices shown in FIG. 3A through FIG. 9B are included. The exemplary set of devices listed in Table 2 may be used to evaluate the reliability of a new semiconductor material or device configuration.

TABLE 2

| Boundary Type | Poly Gate | Cases of Structures | Type of Diffusion | Type of Substrate | Polarity of Gate Bias | Type of Bias |
| --- | --- | --- | --- | --- | --- | --- |
| STI | N+ | D through G | — | P-well | Negative | Accumulation |
| STI | N+ | D through G | — | N-well | Positive | Accumulation |
| STI | P+ | K through N | — | P-well | Negative | Accumulation |
| STI | P+ | K through N | — | N-well | Positive | Accumulation |
| Diff. | N+ | A through C | N+ | P-well | Positive | Inversion |
| Diff. | N+ | A through C | N+ | P-well | Negative | Accumulation |
| Diff. | N+ | O through Q | N+ | P-well | Positive | Inversion |
| Diff. | P+ | H through J | P+ | N-well | Negative | Inversion |
| Diff. | P+ | H through J | P+ | N-well | Positive | Accumulation |
| Diff. | P+ | R through T | P+ | N-well | Negative | Inversion |

The variables include boundary types, gate material, structure type, diffusion material type (if any), substrate material type, bias polarity and type of bias voltage. The type of bias refers to accumulation and inversion. Accumulation is, for example, the accumulation of holes in a P substrate. Inversion, for example, occurs when the surface charge density near a gate conductor is reduced below that of a P-type substrate, resulting in the formation of an electron-rich depletion area.

Figure 3A:
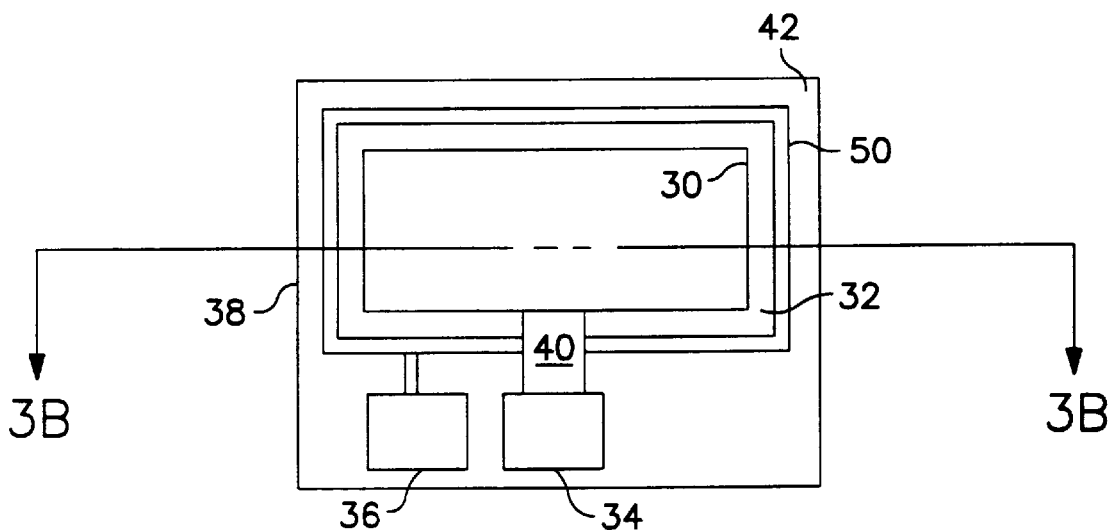
FIG. 3A is a plan view of a semiconductor capacitor with a diffusion region adjoining a continuous rectangular dielectric film.
Figure 3B:
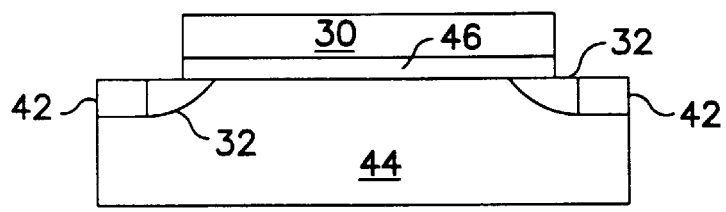
FIG. 3B is a cross-sectional view of the capacitor of FIG. 3A taken along reference line 3B—3B.
Figure 4A:
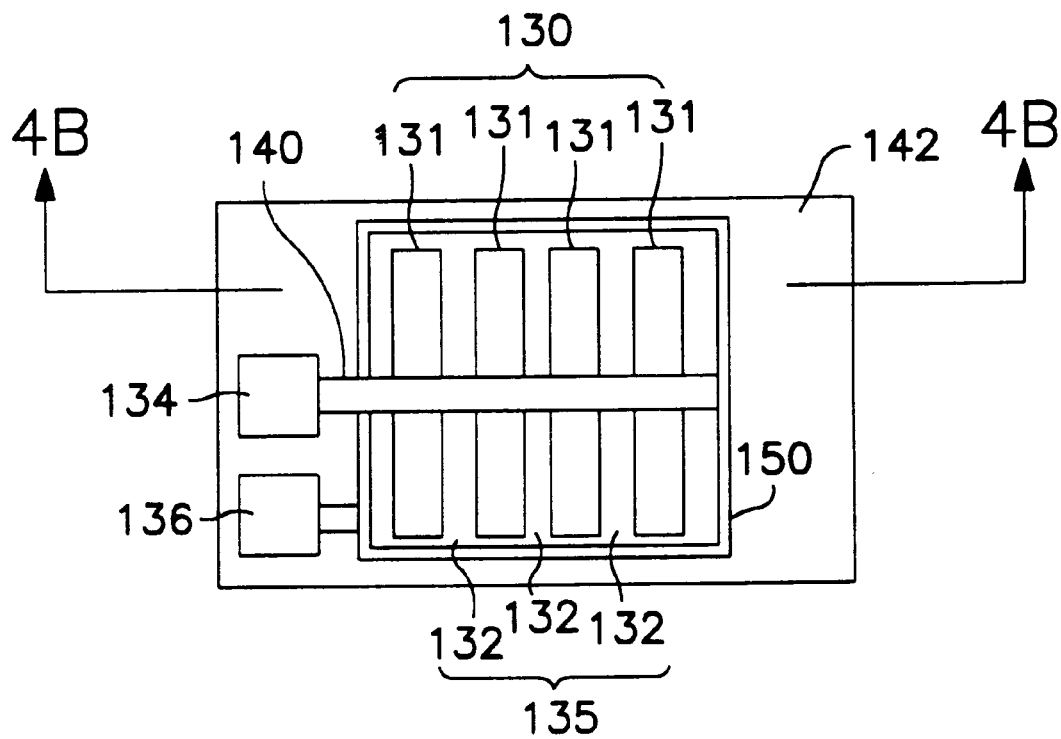
FIG. 4A is a plan view of a semiconductor capacitor with a dielectric film having parallel rows of dielectric material.
Figure 4B:
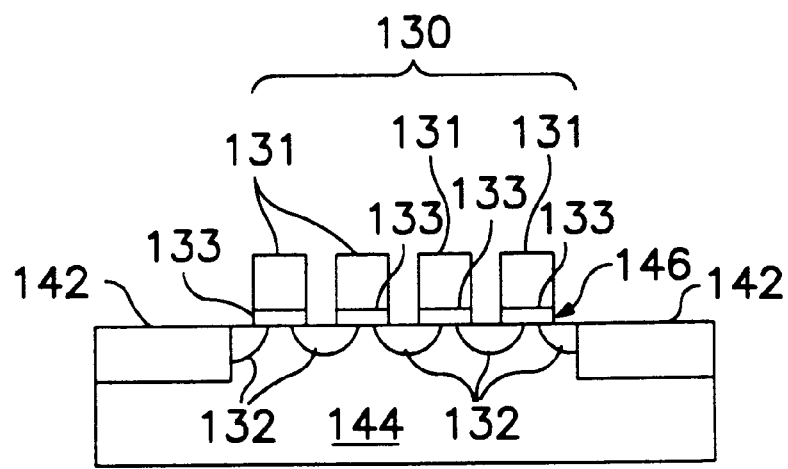
FIG. 4B is a cross-sectional view of the capacitor of FIG. 4A taken along reference line 4B—4B.
Figure 5A:
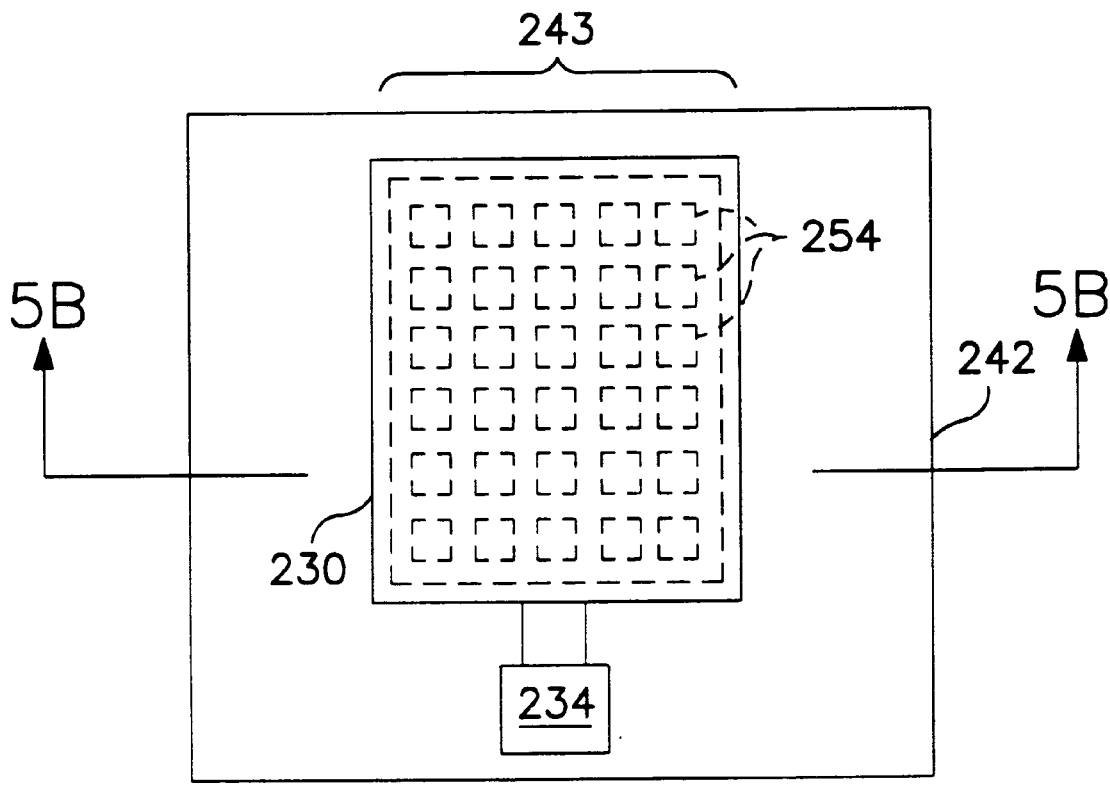
FIG. 5A shows a plan view of a semiconductor device with the polycrystalline silicon gate cut-away to reveal a plurality of dielectric islands surrounded by a grid of shallow-trench-isolation material.
Figure 5B:
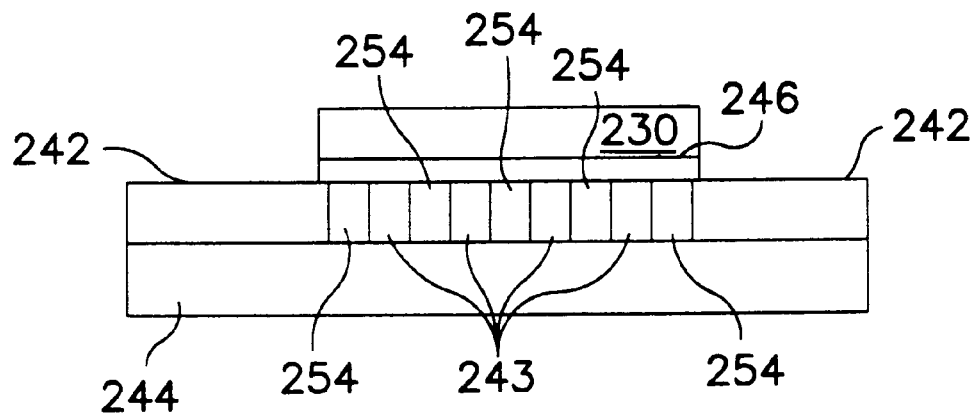
FIG. 5B is a cross-sectional view of the capacitor of FIG. 5A taken along reference line 5B—5B.
Figure 6A:
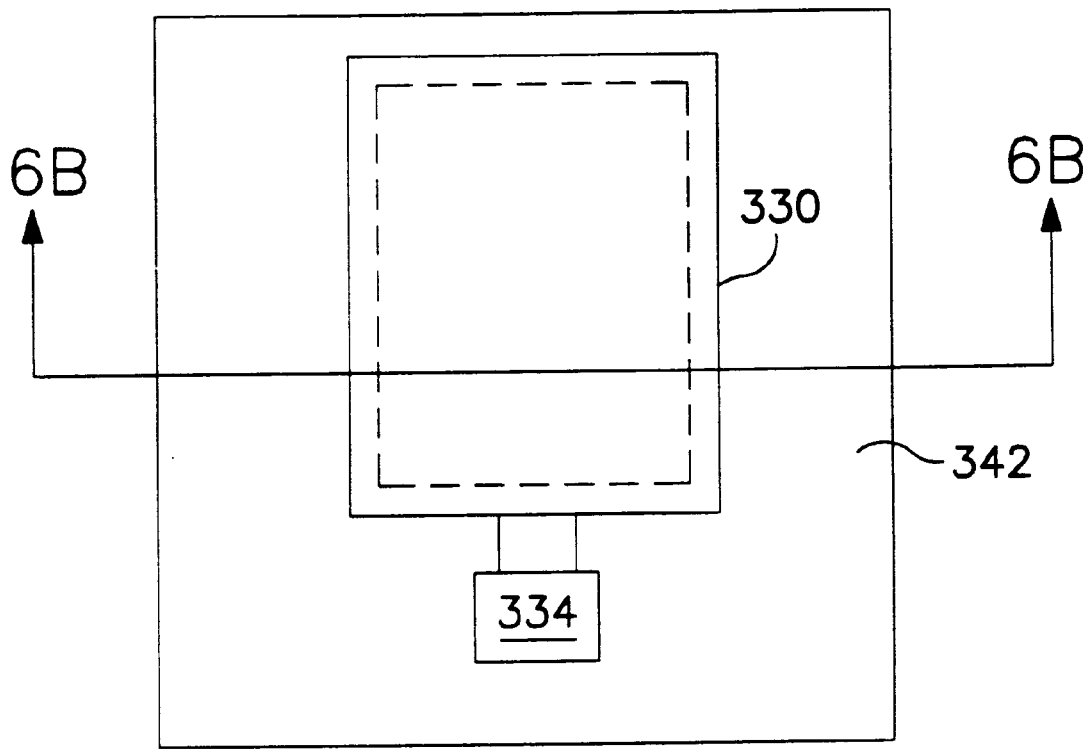
FIG. 6A is a plan view of a semiconductor capacitor with a continuous rectangular dielectric film bounded by an STI region.
Figure 6B:
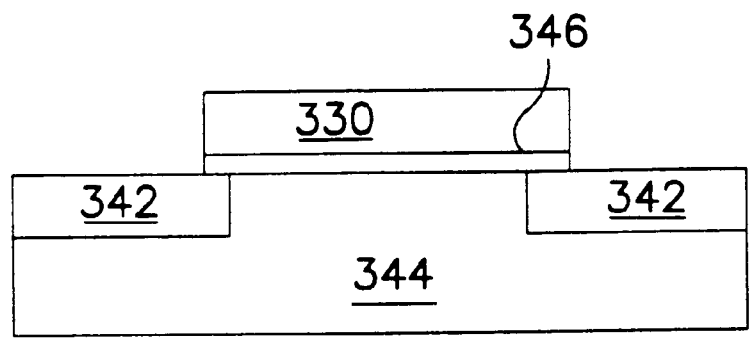
FIG. 6B is a cross-sectional view of the capacitor of FIG. 6A taken along reference line 6B—6B.
Figure 7A:
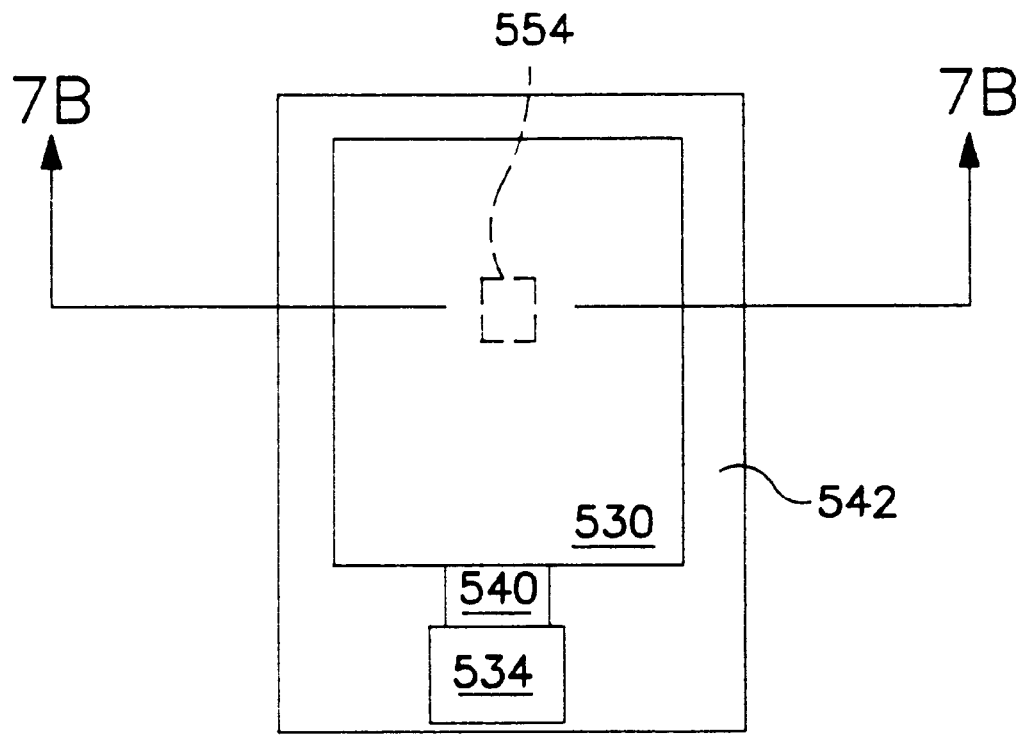
FIG. 7A is a plan view of a semiconductor capacitor with a centrally located rectangular dielectric region surrounded by an STI region.
Figure 7B:
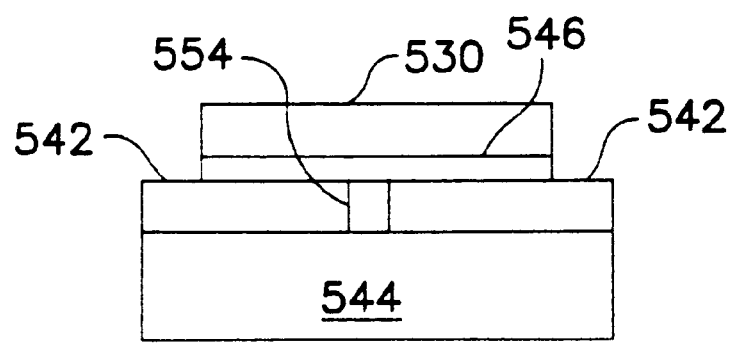
FIG. 7B is a cross-sectional view of the capacitor of FIG. 7A taken along reference line 7B—7B.
Figure 8A:
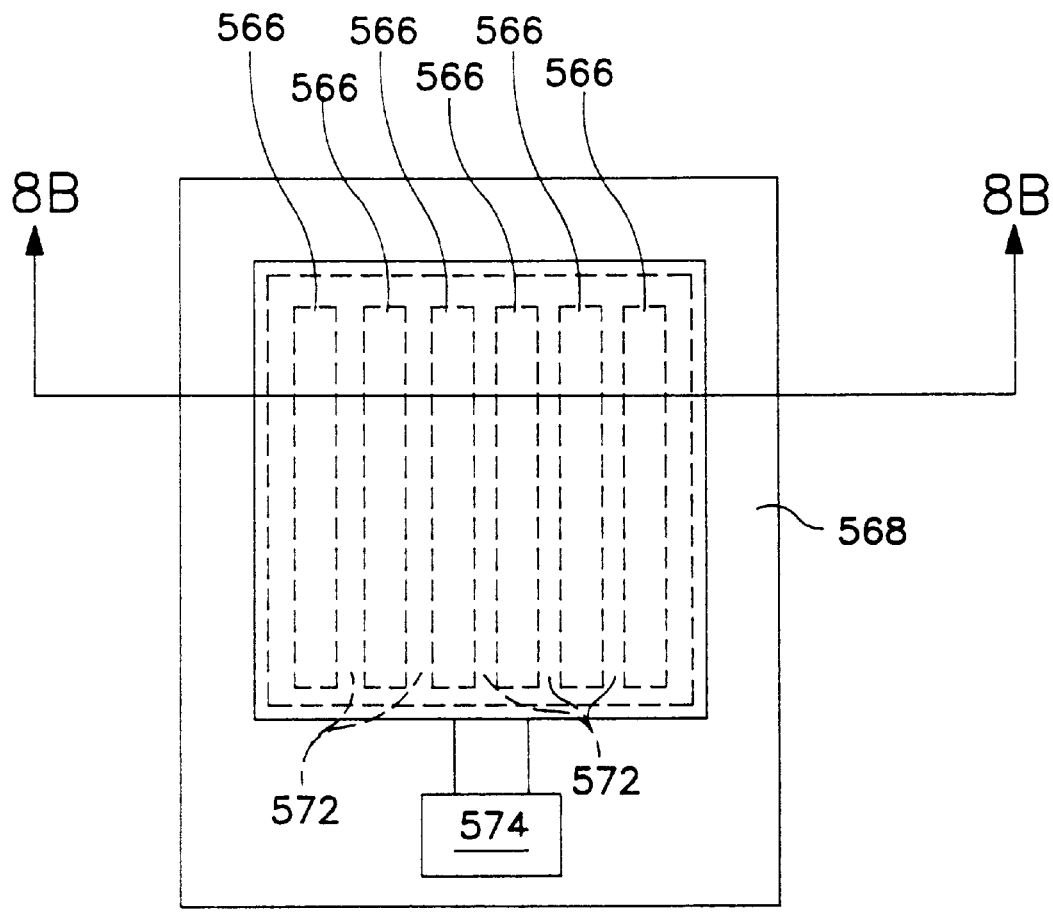
FIG. 8A is a plan view of a semiconductor capacitor with its gate cut away to reveal parallel rows or line of dielectric material surrounded by an STI region.
Figure 8B:
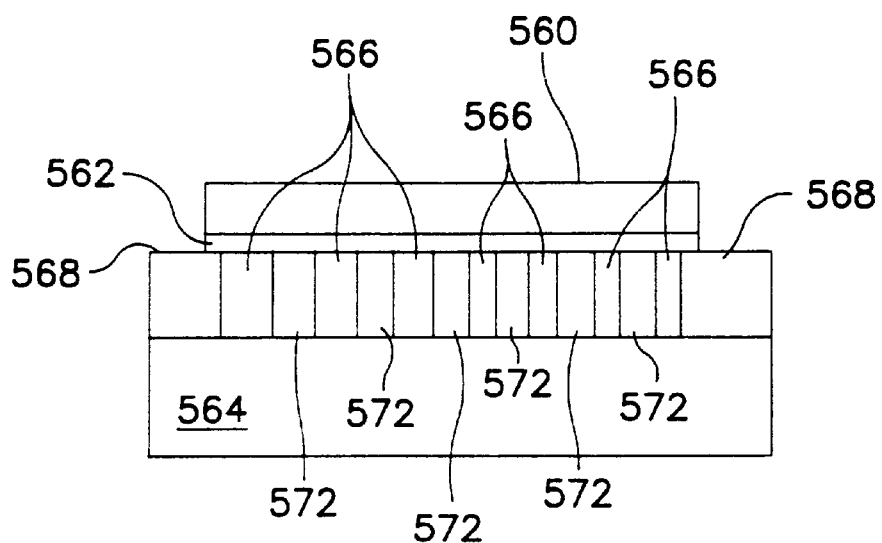
FIG. 8B is a cross-sectional view of the capacitor of FIG. 8A taken along reference line 8A—8A.
Figure 9A:
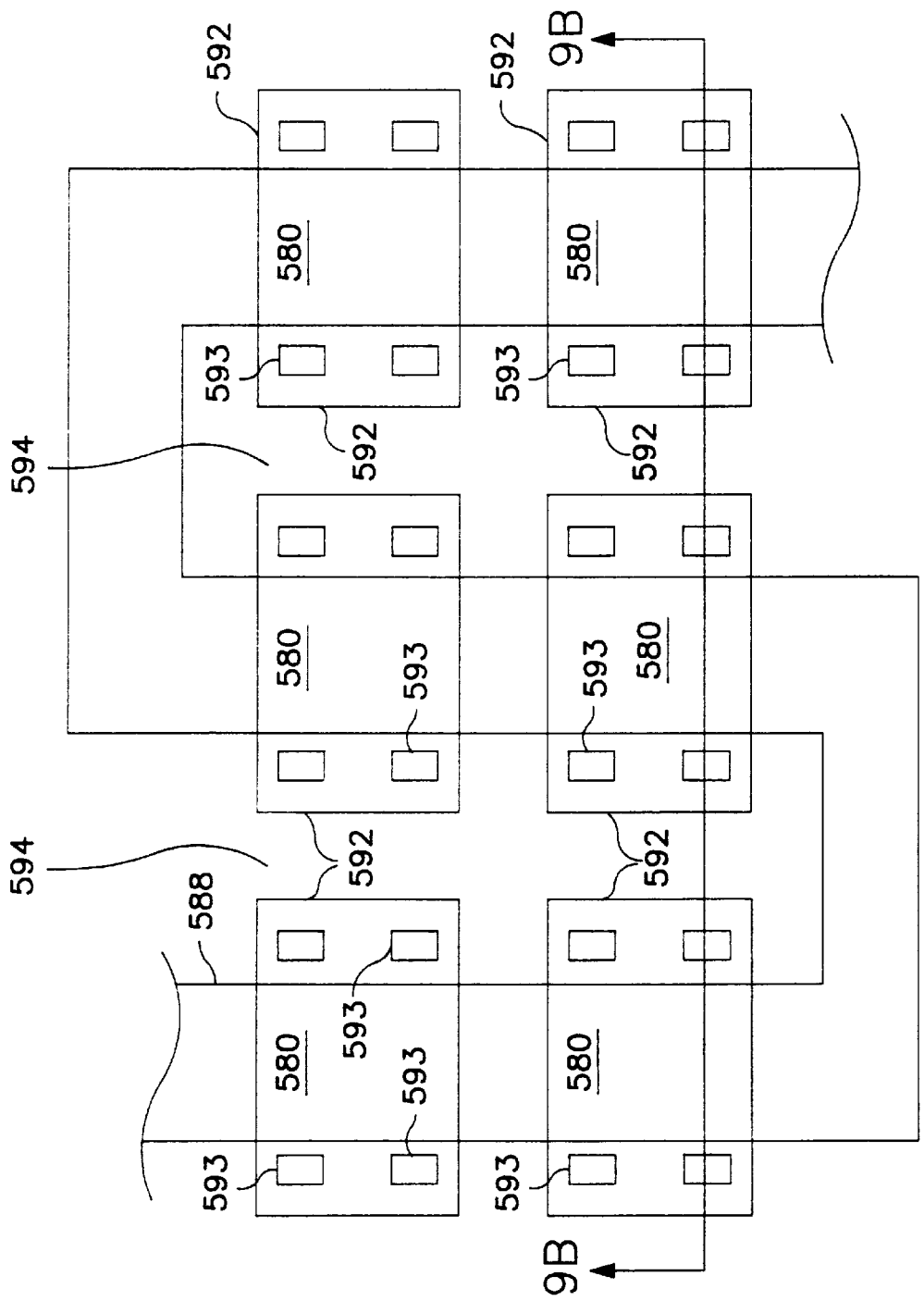
FIG. 9A shows small area rectangles of dielectric material with a circuitous gate conductor having orthogonal bends.
Figure 9B:
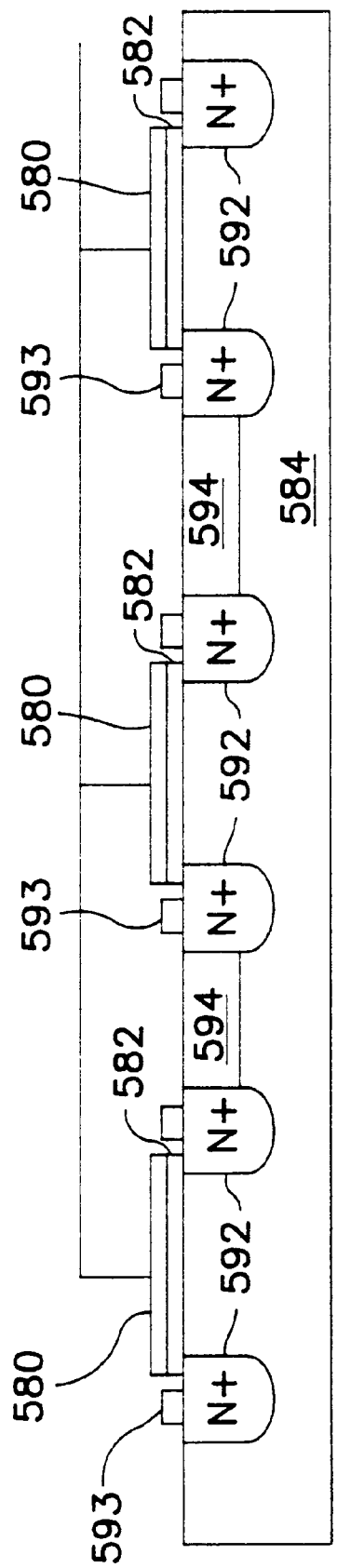
FIG. 9B is a cross-sectional view of FIG. 9A taken along reference lines 9A—9A.

In the exemplary calibration method, the following test devices (referred to herein as "Structure A" through "Structure T") are tested:

Structure A, shown in FIG. 3A and FIG. 3B, is N+ polycrystalline silicon gated, and N+ diffusion region bounded. Structure A has a large area gate dielectric film;

Structure B, shown in FIG. 4A and FIG. 4B, is N+ polycrystalline silicon gated, and N+ diffusion region bounded. Structure B has long-narrow lines of dielectric film;

Structure C, Shown in FIG. 9A and FIG. 9B, is N+ polycrystalline silicon gated, and N+ diffusion region bounded. Structure C has small area rectangles of dielectric film;

Structure D, shown in FIG. 6A and FIG. 6B, is N+ polycrystalline silicon gated and N+ STI region bounded. Structure D has a large area gate dielectric film;

Structure E, shown in FIG. 8A and FIG. 8B, is an N+ polycrystalline silicon gated and STI region bounded. Structure E has long-narrow lines of dielectric film;

Structure F, shown in FIG. 5A and FIG. 5B, is N+ polycrystalline silicon gated and STI region bounded. Structure F has small area squares of dielectric film;

Structure G, shown in FIG. 7A and FIG. 7B, is N+ polycrystalline silicon gated and STI region bounded. Structure G has a small oxide area (charging monitor.);

Structures H through N are similar to Structures A through G, respectively, except Structures H through N have P+ polycrystalline silicon gates and P+ diffusion regions;

Structures O through T are the same as A through C and H through J as above for the diffusion region bounded cases, except that in structures O through T, the gate terminal is connected to a diffusion region at the first metal level of wiring for protection.

The N+ diffusion regions are implanted junctions in a P-well, and the P+ diffusion regions are implanted junctions in the N-well. For the thick oxide bounded or STI bounded devices, both the N+ and the P+ polycrystalline silicon gate conductor could be used over either a P-well or N-well. An N+ diffusion region is used in a P-well region for the N+ polycrystalline silicon gate conductor examples. A P+ diffusion region is used in an N-well region for the P+ polycrystalline silicon gate conductor examples.

The above test devices may be subdivided into two groups. The first group includes gate protected structures; namely, Structures O through T. The second group includes gate-nonprotected structures; namely, structures A through N. The first group connects the gate dielectric film at a first metal level with a diffusion region of the same conductivity type as the gate conductor dopant. In other words, an N+ diffusion is used for an N+ polycrystalline silicon gate and a P+ diffusion for a P+ polycrystalline silicon gate conductor. The second group has no diffusion tied to the gate terminal. The purpose of tying the diffusion region to the gate terminal is for protection against ESD. ESD may be caused by either plasma-induced damage during processing or accidental contact during testing.

Preferably, all of the above test devices have the same total oxide area. However, the perimeter of the gate dielectric film at the boundary of either diffusion or STI region may vary among test devices, depending upon the design. Thus, the ratio of the perimeter to the area varies. For example, between structures A, B, and C. Specifically, the perimeter to area ratio is the highest for the fingered configuration of Structure B and is smallest for the single large area configuration of Structure A.

If all the test devices have the same area, the effect of fabrication process and layout on the test results lifetime is easier to measure. The gate dielectric film area in each of the structures is typically greater than 30,000 $\mu m2$.

The measurements are taken using bias voltages that maximize the electric field across the gate dielectric film under stress conditions without damaging the semiconductor device.

For the thick oxide bounded or shallow trench isolation region bounded devices a negative gate bias voltage is used for the P-well region test devices case and a positive gate bias voltage is used for the N-well region test devices. The bias configurations are such that the silicon surface is accumulated. A negative voltage is applied to the gate conductor and a positive voltage is applied to the P-well substrate, causing hole accumulation in the P-type substrate on the one side of the dielectric. A positive voltage applied to the gate conductor causes depletion or inversion. Inversion is a virtual N-type surface layer formed in a depletion region and isolated from the remainder of the P-type substrate. Minimum voltage drop in the silicon results in a maximum electric field across the gate dielectric film. The voltage drop in the polycrystalline silicon gate conductors, is referred to as "poly depletion."

Two bias conditions are used for the diffusion bounded thin gate dielectric devices. The silicon surface is inverted in the first biasing condition and accumulated in the second biasing condition. In either case, the diffusion regions and the substrate (P-well region for N+ diffusion regions and N-well region for P+ diffusion regions) are at ground potential. In the first biasing condition, the silicon surface at the channel is inverted by applying a positive gate bias voltage to the gate conductor for the N+ diffusion device and P-well case, and by applying a negative gate voltage for the P+ diffusion cases. For silicon surface accumulation, the gate bias polarities are reversed.

For the silicon surface accumulation cases, the test devices do not have any diffusion region tied to the gate conductor, i.e., unprotected gates are used. The two bias conditions are designed to test for dielectric performance under two different carrier injection modes. The first injection mode occurs from the $Si/SiO_2$ interface, The second injection mode occurs from the Polycrystalline silicon/$SiO_2$ interface. For the N+ polycrystalline silicon case, if the gate conductor is positively biased for surface inversion, electrons are injected from the Si/SiO2 interface. For N+ polycrystalline silicon case, if the gate conductor is negatively biased, the electrons are injected from the Polycrystalline silicon/SiSO2 interface.

Preferably, when comparing inversion and accumulation conditions, approximately the same electric fields are applied across the gate dielectric films of the semiconductor devices.

Preferably, at least two gate bias voltages are used for each test device. The first bias voltage is such that the gate current conduction mechanism is in the direct tunneling mode. The direct tunneling mode is defined as an operating region in which the electric field across the gate dielectric film is sufficient to overcome an interface barrier height. The direct tunneling region is associated with a trapezoidal interface barrier; the voltage across the oxide is less than the interface barrier height (Eb) which is about 3 eV for the Silicon/$SiO_2$ interface. The barrier height, Eb is a function of the doping concentration at the interface and the contact system between the metal and the semiconductor. The direct tunneling mechanism may be defined as a region in which the electric field produced by the applied bias is substantially less than 5 MV/cm. The first bias voltage is typically 3 volts or less.

The second bias voltage uses a gate bias value associated with the Fowler-Nordheim conduction mode. The Fowler-Nordheim conduction mechanism conforms to the equations:

$$Log(Jox/Eox^2)=A1-(B1/Eox), \quad (2)$$

$$A1=6.49-Log(Eb), \quad (3)$$

$$B1=21.0 \times (Eb^{1.5}) \quad (4)$$

where Jox is the dielectric current density in Amps/cm$^2$; Eox is the electric field across the gate dielectric film in MV/cm; and Eb is the barrier height, in eV.

The value of the gate bias voltage for the Fowler-Nordheim conduction region is such that the electric field across the dielectric is greater than 5 MV/cm. A typical value of the second bias voltage is 4 volts for the 4 nm gate dielectric thickness. Corresponding values are used for different gate dielectric thicknesses.

The values of the constants in equations (3) and (4) depend directly upon the electron tunneling barrier height Eb, which is the required electron energy to cause conduction into the gate dielectric. By measuring the Fowler Nordheim current at different voltages, the barrier height Eb is readily calculated. For determining the electron barrier height, the following values for the electric field across the dielectric may be used: 8.5 MV/cm, 9.0 MV/cm, 9.5 MV/cm, 10.0 MV/cm, and 10.5 MV/cm.

Figure 2C:
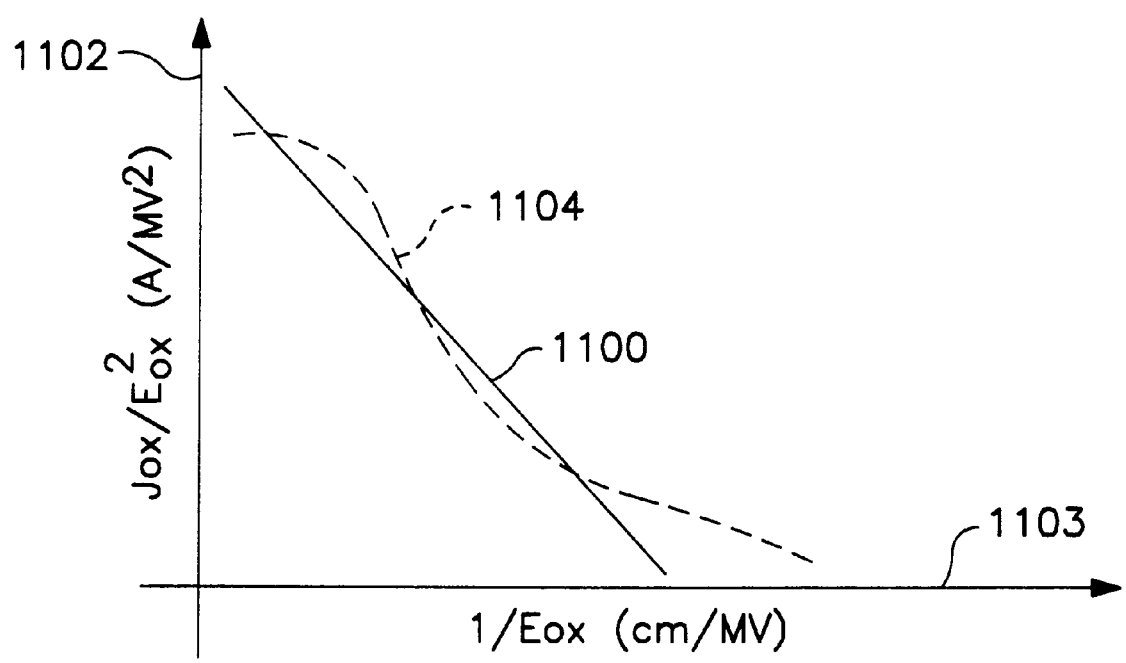
FIG. 2C is a graph of experimental data in which the slope of the graph indicates the barrier height.

The barrier height (Eb) may be determined by the best fit equation of the line 1100 shown in FIG. 2C. The vertical axis 1102 represents $Jox/Eox^2$ in $A/MV^2$ and the horizontal axis 1103 represents $1/Eox^2$. The slope of the line in FIG. 2C represents the barrier height (Eb).

Preferably, the above described calibration operation is performed on all development production lots. The testing covers the technology process tolerances and variations (process window), for such parameters as gate dielectric thickness and the consistency of all of the processing steps involved in the gate dielectric manufacturing. Subsequently, quality control and diagnostic testing is performed routinely on a sampling basis for manufacturing production lots.

The data obtained from the different test devices are very important for assessing the integrity, capabilities, and processes for fabricating each type of gate dielectric film. Analysis of the data may be used to diagnose likely causes for abnormal data or deviations from expected upper control limits. A set of exemplary problems and their causes is provided below. This set is exemplary, and other types of problems may also be diagnosed.

A problem with only one of the two types of gates, N+ or P+, may indicate interaction between the type of gate dopant and the gate dielectric system. For instance, reducing the amount of poly depletion leads to a higher electric field across the oxide; hence, a shorter lifetime of the dielectric oxide. A problem which only applies to P+ gate conductors, may indicate Boron penetration into the gate dielectric film.

A problem which only affects the diffusion bounded structures is likely to be caused by an interaction with the diffusion implanting process. For example, weakening of the dielectric edge at the diffusion overlap region may be due to improper processing of the sidewall, re-oxidation or implant damage at the gate dielectric edge.

Differences in the reliability results between structures that have different perimeter-to-area ratios (but the same gate type, dielectric boundary, and area), may be caused by ESD damage or by metallic contamination.

Differences in the reliability results between protected-diffusion-region structures and non protected-diffusion-region structures are likely caused by dielectric damage induced during plasma processing. This may be detected by the test devices of the charging monitor structure shown in FIGS. 7A and 7B.

A reliability problem present in many of the test structures may be due to a high level of defects, contamination, or general improper processing in silicon surface preparation or cleaning.

A reliability problem for voltages in the Fowler-Nordheim conduction range is likely to be caused by changes in the electron tunneling barrier height (Eb) due, for example, to an interaction with the implant dose and species.

A reliability problem for voltages in both the direct tunneling and the Fowler-Nordheim ranges is likely to be caused by a combination of a high level of defects and changes in the value of the electron tunneling barrier.

Differences between the surface inversion and accumulation bias configurations (for the same electric field strength across the gate dielectric film) in gate currents for the diffusion bounded dielectric cases is likely to be caused by differences in the qualities between the two injecting surfaces (i.e. $Si/SiO_2$ and the Polycrystalline silicon/$SiO_2$ interfaces).

A high variance of the results in a given case is likely to be caused by sub-optimal control of one or more of the dielectric deposition processes or a sensitivity to a particular type of process defect.

FIGS. 3A through 9B show an exemplary set of test semiconductor devices, which may be capacitors. Preferably a variety of test devices (which may be similar to the devices shown in FIGS. 3A–9B) are tested in the calibration operation during the technology development stage. The exemplary set of test devices yields comprehensive test data (during the calibration operation) which may be used to diagnose the root causes of various problems which may later occur during production. Each of the exemplary devices have a polycrystalline silicon gate conductor and a gate dielectric film thickness of 3–10 nanometers (nm), although other dielectric materials and dielectric film thicknesses may be used.

FIGS. 3A and 3B show an example of a semiconductor device having a gate conductor 30, a dielectric film 46, and a substrate 44. The area of the gate dielectric film 46 substantially equals the area of the gate conductor 30. The substrate 44 has a diffusion region 32 at a periphery of the gate dielectric film 46. The diffusion region 32 is surrounded by an STI region 42 near edge 38.

A first pad 34 provides an electrical path to the gate conductor 30 via a gate contact region 40. A second pad 36 provides an electrical path to the diffusion region 32 via a diffusion contact region 50. The pads 34 and 36 are connected to the biasing means.

FIGS. 4A and 4B show a device having a gate conductor 130, a dielectric film 146, and a substrate 144. The gate conductor 130 comprises a first plurality of substantially parallel conductor lines 131. A central gate contact region 140 connects the lines 131.

The gate dielectric film 146 comprises a second plurality of substantially parallel lines 133. The dielectric lines 133 are located underneath the conductor lines 131. The aggregate area of the gate dielectric film 146 substantially equals the aggregate area of the gate conductor 130.

The substrate 144 has a plurality of diffusion regions 132 which lie beneath and between the dielectric lines 133 of the gate dielectric film 146. Each diffusion region 132 partially contacts two adjacent dielectric lines 133. The diffusion regions 132 are surrounded by an STI region 142.

A first pad 134 provides an electrical path to the gate conductor 130. A second pad 136 provides an electrical path to the diffusion region or diffusion regions 132 via a diffusion contact region 150. The pads 134 and 136 are connected to the biasing means.

FIGS. 5A and 5B show a semiconductor device or semiconductor capacitor having a gate conductor 230, a dielectric film 246, and a substrate 244. A contact pad 234 provides an electrical path to the gate conductor 230, and is connected to the biasing means (shown in FIG. 10).

The substrate 244 contains an STI region 242 and an STI grid 243. The STI grid 243 surrounds a plurality of dielectric islands 254, which may be rectangular. The dielectric islands 254 and the STI grid 243 are surrounded by STI region 242.

The gate dielectric film 246 lies over the plurality of dielectric islands 254 which are included within the STI region 242. The aggregate area of the dielectric islands 254 is less than the aggregate area of the gate conductor 230.

FIGS. 6A and 6B show a device having a gate conductor 330, a dielectric film 346 (having a thickness 348), and a substrate 344. The substrate 344 contains an STI region 342. The periphery of the gate dielectric film 346 overlaps the STI region 342. A pad 334 is connected to the biasing means (shown in FIG. 10).

FIG. 7A and FIG. 7B show a semiconductor device or semiconductor capacitor having a gate conductor 530, a dielectric film 546, and a substrate 544. The gate dielectric film 546 overlies a single dielectric island 554, which may be substantially rectangular. The area of the dielectric island 554 is less than the area of the gate conductor 530. The substrate 544 contains an STI region 542. A pad 534 is connected to the biasing means and provides an electrical path to the gate conductor 530 via a gate contact region 540.

FIG. 8A and FIG. 8B show a device having a gate conductor 560, a dielectric film 562, and a substrate 564. A pad 574 couples the gate conductor 560 to the biasing means. The gate conductor 560 may have a rectangular shape. The gate dielectric film 562 lies over a plurality of substantially parallel narrow lines 566. The aggregate area of the lines 566 is less than the area of the gate conductor 560.

The substrate 564 contains STI lines 572 and an STI region 568. The STI region 568 surrounds the lines 566 of the gate conductor 560. The STI lines 572 lie in between the parallel lines 566 of the dielectric material. The gate conductor 560 lies over the STI lines 572.

FIGS. 9A and 9B show a device having a gate conductor 588, a dielectric film 582, and a substrate 584. Discrete rectangular regions 580 of the gate conductor 588 lie over the gate dielectric film 582. The gate dielectric film 582 comprises a plurality of rectangular dielectric islands 580. The gate conductor 588 is defined by a circuitous polycrystalline silicon line with bends, which may be orthogonal.

The substrate 584 contains diffusion regions 592 having diffusion contacts 593. The dielectric islands 580 overlap adjacent diffusion regions 592. Some of the diffusion regions 592 are separated by STI regions 594. All of the diffusion contacts 593 are connected at the metal level.

Figure 10:
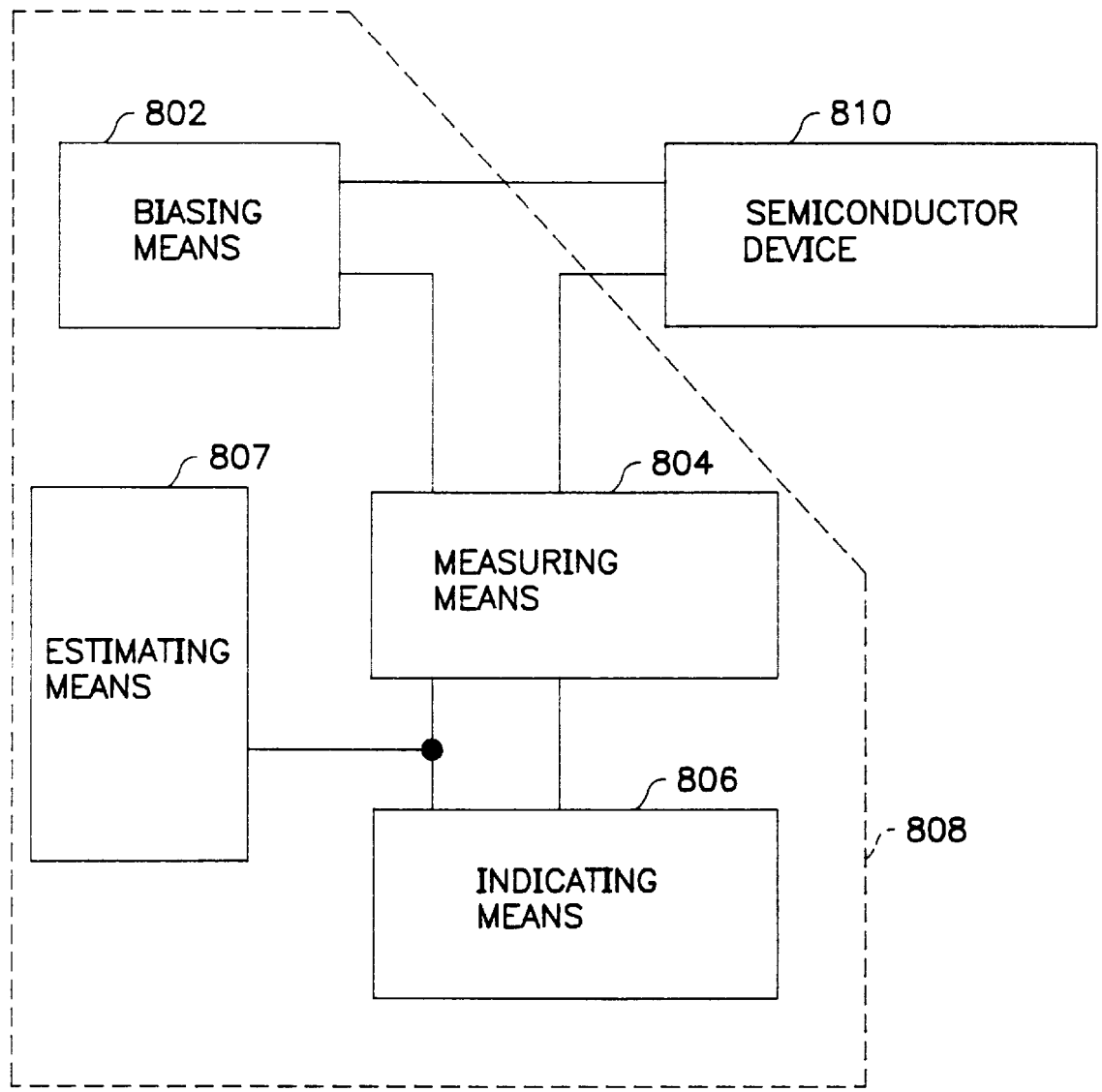
FIG. 10 is a block diagram of a first embodiment of the test system for evaluating gate dielectric film longevity.

FIG. 10 shows a first embodiment of the system 808 for testing a semiconductor device 810. The system 808 may includes biasing means 802, measuring means 804, indicating means 806 and estimating means 807. The test system 808 is coupled to a semiconductor device 810 to estimate the reliability or longevity of the semiconductor device 810.

The biasing means 802 may comprise an energy source, such as a direct current voltage supply, a rectifier, a battery, or the like. The energy source is preferably voltage regulated and preferably has an adjustable output voltage. The output voltage is adjusted if semiconductor devices having different dielectric film thicknesses are used.

The biasing means 802 provide a bias voltage within a predetermined range. The predetermined range includes a first bias voltage that does not apply significant stress to the gate dielectric film of the semiconductor device 810. The predetermined range also includes a second voltage that applies stress to the semiconductor device 810 in the Fowler-Nordheim conduction range.

The lifetime of the semiconductor device 810 or the time-to-breakdown is determined when significant changes in the gate current occurs. The measuring means 804 may comprise a current monitor, a current meter, an analog current meter, a digital current meter, an oscilloscope, an ammeter, or the like. The measuring means 804 preferably measures direct current drawn by the semiconductor device 810.

The indicating means 806 indicates whether the initial gate current exceeds a threshold, which indicates unsatisfactory reliability. The calibration data described above are used to set the threshold current. The threshold is selected based on the reliability requirement in actual use conditions for the intended lifetime of the semiconductor device 810.

The indicating means 806 may provide an output as a logic signal, a contact closure, or another signal to indicate that a measured current is in excess of a predetermined threshold current. The output of the indicating means 806 may be connected to activate an alarm, siren, light which indicates that the gate dielectric film of the measured semiconductor device 810 is suspect or defective.

The indicating means 806 may comprise a current-to-voltage converter (i.e. a transimpedance amplifier), a reference voltage source, and a threshold comparator circuit. The current-to-voltage converter converts the gate current of the semiconductor device 810 into a voltage proportional in magnitude to the measured current. The current-to-voltage converter may be placed in series with the semiconductor device 810 and the biasing means 802. The voltage output of the current-to-voltage converter is coupled to a comparing input of a comparator, while the reference source is coupled to a reference input of the comparator. The comparator changes its logic state in response to a voltage at the comparing input exceeding the voltage at the voltage reference input. The voltage at the voltage reference input sets the predetermined threshold. The output of the comparator may be coupled to an alarm, indicator, siren or another external device through a suitable relay circuit. The external device may include a device used in the manufacturing process to segregate or discard defective semiconductor devices. Therefore, the indicating means 806 indicates a potential reliability problem with the gate dielectric film if the initial gate current exceeds the predetermined threshold.

The semiconductor device 810 may comprise for example an FET (field-effect transistor), a MOSFET (metal oxide field-effect transistor), an integrated circuit, a semiconductor capacitor, a metal oxide semiconductor capacitor, or the like.

The semiconductor device 810 is coupled to the biasing means 802 so that the semiconductor device 810 acts as a capacitor. In other words, the current path is established between the gate on one side of a dielectric film and the semiconductor region on the opposite side of the dielectric material.

Figure 11:
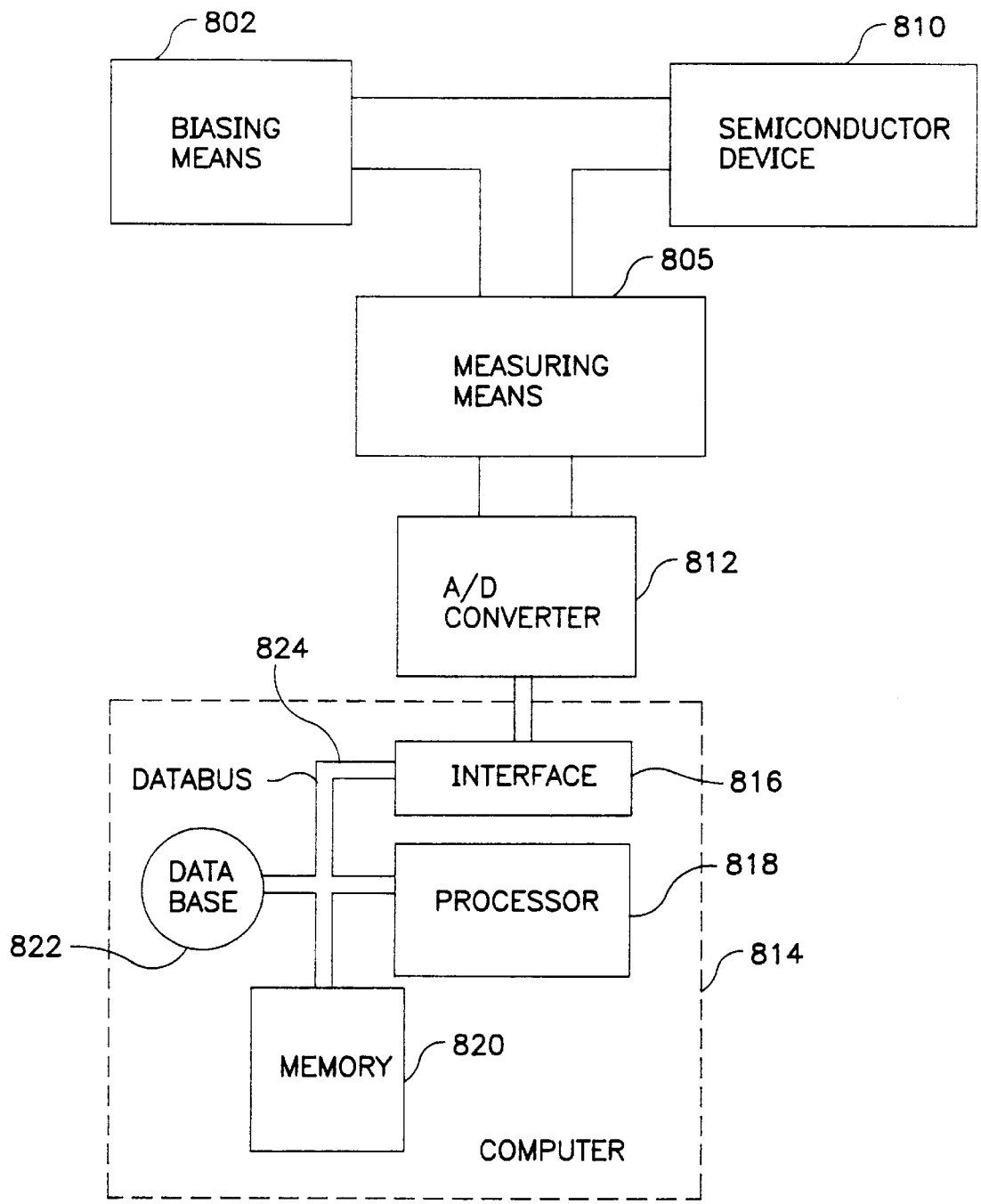
FIG. 11 is a block diagram of a second embodiment of the test system for evaluating gate dielectric film longevity.

FIG. 11 shows a second embodiment of the test system for evaluating the dielectric longevity of a semiconductor device 810 having a dielectric film and a gate conductor. The description associated with FIG. 10 describes the biasing means 802 and semiconductor device 810 FIG. 11.

The measuring means 805 preferably measures magnitude of the direct current, while the semiconductor device 810 is biased. The measuring means 805 of FIG. 11 may provide an analog voltage output. The magnitude of the analog voltage output is preferably proportional to the magnitude of the measured initial gate current of the gate conductor. In other words, the measuring means 805 may comprise a transimpedance amplifier. The analog output is coupled to an optional analog-to-digital converter 812. The analog-to-digital converter 812 is not required if the measuring means is equipped with a digital output, representing the measured gate current. If the measuring means 805 has a digital output, the digital output may be connected directly to the estimating means 814 or a computer.

The estimating means 814 for estimating the longevity of the gate dielectric film preferably comprises a computer and a database 822 associated with the computer. The estimating means 814 estimates the longevity based upon the initial gate current measured and reference data on the initial gate current during stress versus longevity of the semiconductor device 810.

The computer has an interface 816, a processor 818, a memory 820 and a database 822. The database 822 may be stored on a magnetic medium (i.e. hard disk-drive), an optical medium (i.e. optical disk), or in memory 820 (i.e. electronic erasable read only memory (EEPROM) or random access memory (RAM)). The interface 816, the processor 818, the memory 820 and the database 822 communicate to each other via the databus 824. The interface 816 comprises a UART (universal asynchronous receiver-transceiver), an SCSI (small computer system interface), a serial data port, a parallel data port, or the like.

The estimating means 814 may include timing means for timing the dielectric longevity of the semiconductor device 810 after being biased. The timing means may comprise a timer, a clock, or a timer or a clock associated with the computer. The dielectric longevity is optimally measured from a start time of initial biasing under accelerated stress conditions. The time is measured until a stop time or when significant changes in the measured gate current occur.

The database 822 stores data concerning the initial gate current during stress measured versus the dielectric longevity time. Preferably, the database 822 stores an attribute, representing a structural characteristic of the semiconductor device 810. For example, the third attribute may be a record containing information on the semiconductor-dielectric boundary type, the perimeter length, the area of the gate dielectric film, and the geometry of the gate dielectric film. The database may also store the measured constants K and n (described above) which define the power law relationship for a given material and device configuration.

Alternatively, the database 822 may have attributes representing raw data, including gate currents and gate dielectric film longevities associated with the gate currents.

The database 822 contains data on a power law relationship between the dielectric longevity and initial gate current. Consequently, the data may be stored as a series of power law curve equations associated with or referenced by different semiconductor devices. Similarly, the data may be stored as line equations with reference to logarithmic coordinates. The power law relationship conforms to equation (1), above.

Although an exemplary set of test semiconductor device configurations is described above, one of ordinary skill in the art can readily select an alternative set of device configurations for performing the calibration operation in accordance with the invention.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A method for estimating the longevity of a gate dielectric film of a semiconductor device, the method comprising the steps of:
   (a) biasing the semiconductor device with a predetermined bias voltage;
   (b) measuring a gate current drawn through the gate dielectric film of the semiconductor device in response to the predetermined bias voltage; and
   (c) estimating the longevity of the gate dielectric film based on the measured gate current wherein a relationship to estimate the longevity is approximately defined by the formula:

$$tbd = K \times Ig^n,$$

where tbd is the estimated longevity of the semiconductor device, K and n are constants, and Ig is the gate current of the semiconductor device.

2. The method according to claim 1 further comprising the steps of:
   (1) applying a plurality of test bias voltages to a plurality of test semiconductor devices;
   (2) measuring a plurality of test gate currents drawn in the respective dielectric films of the test semiconductor devices in response to the test bias voltages;
   (3) determining a relationship between the test gate currents and the longevity of the test semiconductor devices, wherein steps (1), (2) and (3) are performed before step (a); and
   (c1) using the relationship to estimate the longevity of the gate dielectric film in step (c).

3. The method according to claim 2 wherein the test bias voltages include:
   a first test voltage which produces a first gate current in a direct tunneling mode, and
   a second test voltage, which produces a second gate current in a Fowler-Nordheim conduction mode.

4. The method according to claim 2 wherein at least one of the semiconductor test devices is a diffusion region bounded gate device, and
   step (1) includes biasing said diffusion region bounded gate device with two different test bias voltages in a surface inversion mode, and a surface accumulation mode, respectively.

5. The method according to claim 2 wherein at least one of the semiconductor test devices is an isolation region bounded gate device, and
   step (1) includes biasing said isolation region bounded gate device in a surface accumulation mode.

6. The method according to claim 2, wherein the plurality of test semiconductor devices include semiconductor devices of different semiconductor device types having respectively different conductivity types, diffusion region areas, and isolation region areas.

7. The method according to claim 6, further comprising the step of:
   (4) determining an area and shape of the gate dielectric film of the semiconductor device of step (a), based on the test gate currents measured in step (2) for the semiconductor device type of the semiconductor device of step (a).

8. The method according to claim 6, further comprising the step of identifying a reliability problem associated with one of the semiconductor device types through a comparison of the test gate currents measured for each respective semiconductor device type.

9. The method according to claim 1, wherein the method is used for quality control in a manufacturing process, the method further comprising the step of:
   (d) rejecting the semiconductor device if the estimated longevity is below a threshold value.

10. The method according to claim 1, wherein the predetermined bias voltage is sufficiently small so as to avoid damaging the gate dielectric film.

11. A system for estimating the longevity of a gate dielectric film of a semiconductor device comprising:
    biasing means for biasing the semiconductor device with a predetermined bias voltage;
    measuring means for measuring a gate current drawn through the gate dielectric film of the semiconductor device in response to the predetermined bias voltage;
    estimating means for estimating the longevity of the gate dielectric film based on the measured gate current; and calibration means for determining a relationship between the longevity of a plurality of a test semiconductor devices and respective test gate currents measured in each one of the plurality of test semiconductor devices, wherein the estimating means uses the relationship determined by the calibration means to estimate the longevity of the gate dielectric film.

12. The system according to claim 11, further comprising:

indicating means for indicating if the measured gate current exceeds a predetermined threshold current.

13. The system according to claim 11, wherein the predetermined bias voltage is sufficiently small so as to avoid damaging the gate dielectric film.

14. The system according to claim 11, wherein the calibration means determines the relationship approximately by the formula:

$$tbd = K \times Ig^n,$$

where tbd is the estimated longevity of the semiconductor device, K and n are constants, and Ig is the gate current of the semiconductor device.

15. The system according to claim 11, wherein the calibration means applies at least two test bias voltages to the test semiconductor devices, including:

a first test voltage which produces a first gate current in a direct tunneling mode, and a second test voltage, which produces a second gate current in a Fowler-Nordheim conduction mode.

16. A non-destructive method for estimating the longevity of a gate dielectric film of a semiconductor device, the method comprising the steps of:

(a) biasing the semiconductor device with a predetermined bias voltage;

measuring a gate current drawn through the gate dielectric film of the semiconductor device in response to the predetermined bias voltage; and (c) estimating the longevity of the gate dielectric film based on the measured gate current, whereby the estimating of longevity is non-destructive of the gate dielectric film.

17. The non-destructive method according to claim 16 further comprising the steps of:

(1) applying a plurality of test bias voltages to a plurality of test semiconductor devices;

(2) measuring a plurality of test gate currents drawn in the respective dielectric films of the test semiconductor devices in response to the test bias voltages;

(3) determining a relationship between the test gate currents and the longevity of the test semiconductor devices, wherein steps (1), (2) and (3) are performed before step (a); and (c1) using the relationship to estimate the longevity of the gate dielectric film in step (c).

18. The non-destructive method according to claim 16 wherein the relationship is approximately defined by the formula:

$$tbd = K \times Ig^n,$$

where tbd is the estimated longevity of the semiconductor device, K and n are constants, and Ig is the gate current of the semiconductor device.

19. The non-destructive method according to claim 17 wherein the test bias voltages include:

a first test voltage which produces a first gate current in a direct tunneling mode, and a second test voltage, which produces a second gate current in a Fowler-Nordheim conduction mode.

20. The non-destructive method according to claim 17 wherein at least one of the semiconductor test devices is a diffusion region bounded gate device, and step (1) includes biasing said diffusion region bounded gate device with two different test bias voltages in a surface inversion mode, and a surface accumulation mode, respectively.

21. The non-destructive method according to claim 17 wherein at least one of the semiconductor test devices is an isolation region bounded gate device, and step (1) includes biasing said isolation region bounded gate device in a surface accumulation mode.

22. The non-destructive method according to claim 17, wherein the plurality of test semiconductor devices include semiconductor devices of different semiconductor device types having respectively different conductivity types, diffusion region areas, and isolation region areas.

23. The non-destructive method according to claim 22, further comprising the step of:

(4) determining an area and shape of the gate dielectric film of the semiconductor device of step (a), based on the test gate currents measured in step (2) for the semiconductor device type of the semiconductor device of step (a).

24. The non-destructive method according to claim 22, further comprising the step of identifying a reliability problem associated with one of the semiconductor device types through a comparison of the test gate currents measured for each respective semiconductor device type.

25. The non-destructive method according to claim 16, wherein the method is used for quality control in a manufacturing process, the method further comprising the step of:

(d) rejecting the semiconductor device if the estimated longevity is below a threshold value.

26. The non-destructive method according to claim 16, wherein the predetermined bias voltage is sufficiently small so as to avoid damaging the gate dielectric film.

27. A non-destructive method for testing a semiconductor device having a gate dielectric film, the method comprising the steps of:

(a) biasing the semiconductor device with a predetermined bias voltage;

(b) measuring a gate current drawn through the gate dielectric film of the semiconductor device in response to the predetermined bias voltage; and (c) rejecting the semiconductor device if the measured gate current exceeds a threshold value, whereby the testing of the gate dielectric film is non-destructive.

28. The non-destructive method according to claim 27 further comprising the steps of:

(1) applying a plurality of test bias voltages to a plurality of test semiconductor devices;

(2) measuring a plurality of test gate currents drawn in the respective dielectric films of the test semiconductor devices in response to the test bias voltages;

(3) determining a relationship between the test gate currents and the longevity of the test semiconductor devices, wherein steps (1), (2) and (3) are performed before step (a); and (c1) using the relationship to determine the threshold value of step (c).

29. A non-destructive system for estimating the longevity of a gate dielectric film of a semiconductor device comprising:

biasing means for biasing the semiconductor device with a predetermined bias voltage;

measuring means for measuring a gate current drawn through the gate dielectric film of the semiconductor device in response to the predetermined bias voltage; and estimating means for estimating the longevity of the gate dielectric film based on the measured gate current, whereby the estimating of the longevity of the gate dielectric is non-destructive.

30. The non-destructive system according to claim 29, further comprising:

indicating means for indicating if the measured gate current exceeds a predetermined threshold current.

31. The non-destructive system according to claim 29, wherein the predetermined bias voltage is sufficiently small so as to avoid damaging the gate dielectric film.

32. The non-destructive system according to claim 29, further comprising:

calibration means for determining a relationship between the longevity of a plurality of test semiconductor devices and a respective test gate currents measured in each one of the plurality of test semiconductor devices, wherein the estimating means uses the relationship determined by the calibration means to estimate the longevity of the gate dielectric film.

33. The non-destructive system according to claim 32, wherein the calibration means determines the relationship approximately by the formula:

$$tbd = K \times Ig^n,$$

where tbd is the estimated longevity of the semiconductor device, K and n are constants, and Ig is the gate current of the semiconductor device.

34. The non-destructive system according to claim 32, wherein the calibration means applies at least two test bias voltages to the test semiconductor devices, including:

a first test voltage which produces a first gate current in a direct tunneling mode, and a second test voltage, which produces a second gate current in a Fowler-Nordheim conduction mode.

35. A non-destructive system for testing a gate dielectric film of a semiconductor device comprising:

biasing means for biasing the semiconductor device with a predetermined bias voltage;

measuring means for measuring a gate current drawn through the gate dielectric film of the semiconductor device in response to the predetermined bias voltage; and indicating means for indicating if the measured gate current exceeds a threshold value, whereby the testing of the gate dielectric film is non-destructive.

* * * * *